United States Patent

Suga

[11] Patent Number: 5,825,058
[45] Date of Patent: Oct. 20, 1998

[54] SEMICONDUCTOR IC WITH FET AND CAPACITOR HAVING SIDE WALL SPACERS

[75] Inventor: Shigeru Suga, Hamamatsu, Japan

[73] Assignee: Yamaha Corporation, Japan

[21] Appl. No.: 906,309

[22] Filed: Aug. 5, 1997

Related U.S. Application Data

[62] Division of Ser. No. 654,833, May 29, 1996, Pat. No. 5,698,463.

[30] Foreign Application Priority Data

May 29, 1995 [JP] Japan .................................. 7-130793

[51] Int. Cl.⁶ ............................................... H01L 21/8242
[52] U.S. Cl. ........................... 257/300; 257/306; 257/311
[58] Field of Search ..................................... 257/300, 304, 257/306, 311; 438/253, 250, 393, 396

[56] References Cited

U.S. PATENT DOCUMENTS

| | | |
|---|---|---|
| 4,367,580 | 1/1983 | Guterman . |
| 4,419,812 | 12/1983 | Topich . |
| 4,737,838 | 4/1988 | Watanabe . |
| 4,753,898 | 6/1988 | Parrillo et al. . |
| 5,173,437 | 12/1992 | Chi . |
| 5,218,511 | 6/1993 | Nariani . |

OTHER PUBLICATIONS

S. Wolf Ph.D., "MOS Devices and NMOS Process Integration", Silicon Processing for The VLSI Era, vol. 2: Process Integration, Lattice Press, Sunset Beach, California, 1990, pp. 354–361.

Primary Examiner—Jey Tsai

[57] ABSTRACT

On the principal surface of an Si semiconductor substrate, a field oxide film is formed defining an active region. On the active region, an insulated gate structure is formed including a gate oxide film and a polycrystalline Si layer. At the same time, a lower capacitor electrode of the polycrystalline Si layer is formed on the field oxide film. The surface of the polycrystalline layer is oxidized to form an insulating film. Another polycrystalline Si layer is deposited covering the insulating film. A mask is formed over the lower capacitor electrode. By using this mask as an etching mask, anisotropic etching is performed to leave an upper capacitor electrode and side wall spacers on the side walls of the gate electrode and lower capacitor electrode.

10 Claims, 4 Drawing Sheets

SEMICONDUCTOR IC WITH FET AND CAPACITOR HAVING SIDE WALL SPACERS

This is a division of application Ser. No. 08/654,833, filed May 29, 1996, U.S. Pat. No. 5,698,463.

BACKGROUND OF THE INVENTION a) Field of the Invention

The present invention relates to a semiconductor device and its manufacture method, and more particularly to a semiconductor device with insulated gate type field effect transistors and capacitors and its manufacture method.

b) Description of the Related Art

Some analog ICs have MOS transistors in active regions and capacitors on a field oxide film. The lower electrode of the capacitor is formed through the same process as that for forming the gate electrode of the MOS transistor. An insulating dielectric film and an upper electrode of the capacitor are formed by other processes different from the processes of forming a MOS transistor. Therefore, as compared to general digital IC manufacture processes, at least a dielectric film forming process, an upper capacitor electrode forming process, and a patterning process are additionally used. The additional processes raise manufacture cost.

SUMMARY OF THE INVENTION

It is an object of the present invention to provide a semiconductor device having an insulated gate type field effect transistor in an active region and a capacitor on a field oxide film, capable of reducing the number of manufacture processes.

It is another object of the present invention to provide a novel structure of a semiconductor device having an insulated gate type field effect transistor in an active region and a capacitor on a field oxide film.

It is a further object of the present invention to provide a method of manufacturing a semiconductor device capable of forming an insulated gate type field effect transistor in an active region and a capacitor on a field oxide film, with a less number of manufacture processes.

According to one aspect of the present invention, there is provided a semiconductor device comprising: a semiconductor substrate with a principal surface; a field insulating film formed on the principal surface of the semiconductor substrate and defining an active region; an insulated gate structure formed in the active region and including a gate insulating film and a first conductive layer; a lower capacitor electrode formed on the field insulating film and including a second conductive layer having substantially same composition and thickness as the first conductive layer; an insulating film formed on the surfaces of the first and second conductive layers; conductive side wall regions formed on side walls of the first and second conductive layers; and an upper capacitor electrode formed on the insulating film on the upper surface of the second conductive layer and made of the same material as the conductive material of the conductive side wall regions. It is possible to form the upper capacitor electrode and the side walls of the insulated gate structure by the same process.

According to another aspect of the present invention, there is provided a method of manufacturing a semiconductor device comprising the steps of: depositing a first conductive layer on a semiconductor substrate having a gate insulating film and a field insulating film on a principal surface of the semiconductor substrate; patterning the first conductive layer to form a gate electrode on the gate insulating film and a lower capacitor electrode on the field insulating film; forming an insulating film on the surfaces of the gate electrode and the lower capacitor electrode; depositing a second conductive layer over the semiconductor substrate, the second conductive layer covering the insulating film; forming a mask over the lower capacitor electrode; and anisotropically etching the second conductive layer by using the mask to leave side wall regions on side walls of the lower capacitor electrode and the gate electrode and an upper capacitor electrode over the lower capacitor electrode.

After the gate electrode of an insulating gate type field effect transistor (FET) and the lower capacitor electrode are covered with the insulating film, the side wall regions and the upper capacitor electrode can be formed by the same process. Therefore, the number of manufacture processes can be reduced.

By adding the process of forming the insulating film and the process of forming a mask for the upper capacitor electrode, a capacitor can be formed on the field oxide film. The insulating film forming process may be performed by thermal oxidation.

In the above manner, a semiconductor device having an insulating gate type FET in an active region and a capacitor on a field oxide film can be formed with simplified manufacture processes.

DETAILED DESCRIPTION OF THE PREFERRED EMBODIMENTS

Embodiments of the invention will be described with reference to the accompanying drawings.

Figure 1A:
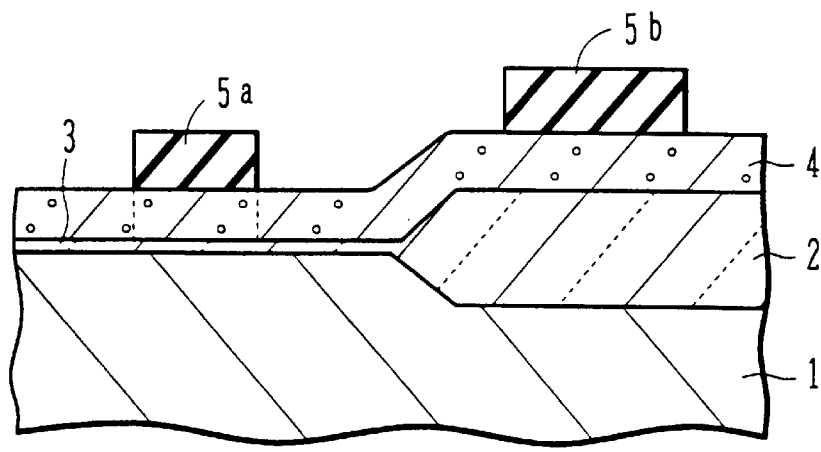
FIGS. 1A to 1F are cross sectional views of a semiconductor substrate illustrating the manufacture processes of semiconductor devices according to an embodiment of the invention.

As shown in FIG. 1A, a field oxide film 2 and a gate oxide film 3 are formed on the principal surface of an Si semiconductor substrate 1. For example, a buffer oxide film is first formed on the principal surface of the semiconductor substrate 1, and a nitride film is deposited on the buffer oxide film. After the nitride film is patterned, the substrate is selectively and thermally oxidized in a wet atmosphere containing moisture and oxygen, by using the patterned nitride film as a mask, to thereby form the field oxide film 2 having a desired thickness and surrounding an active region. In a semiconductor IC chip, a plurality of active regions are simultaneously defined. A new gate oxide film 3 may be formed after removing the nitride film and buffer oxide film on the active region. Alternatively, after the nitride film is removed, the buffer oxide film may be used as the gate oxide film 3.

On the surface of the semiconductor substrate formed with the gate oxide film 3 and field oxide film 2 in the above manner, a polycrystalline Si layer 4 of about 200 to 400 nm is deposited by chemical vapor deposition (CVD) using Si source gas such as silane. If impurities doped at later processes are insufficient, an impurity doped polycrystalline Si layer may be formed. Alternatively, after an Si layer is formed, impurity ions may be implanted. Instead of depositing polycrystalline Si, amorphous Si may be deposited and changed to polycrystalline Si at a later heat treatment. A polycide structure may be used in place of a single Si layer, by forming a refractory metal silicide layer on a Si layer.

The conditions of forming the polycrystalline Si layer 4 are, for example:

gas=SiH$_4$+He;

pressure=35Pa; and temperature=600° C.

Refractory metal silicide is formed, for example, to a thickness of 100 to 200 nm by sputtering. This polycrystalline Si layer 4 may be replaced with an oxidizable conductive material including refractory metals such as W, Mo, and Ta and their silicide.

A photoresist layer, for example, of novolak, is spin-coated on the polycrystalline Si layer 4, and exposed and developed to form resist patterns 5a and 5b. The resist pattern 5a has a shape corresponding to a gate electrode of a MOS transistor to be formed in the active region, and the resist pattern 5b has a shape corresponding to a lower capacitor electrode to be formed on the field oxide film.

Figure 1B:
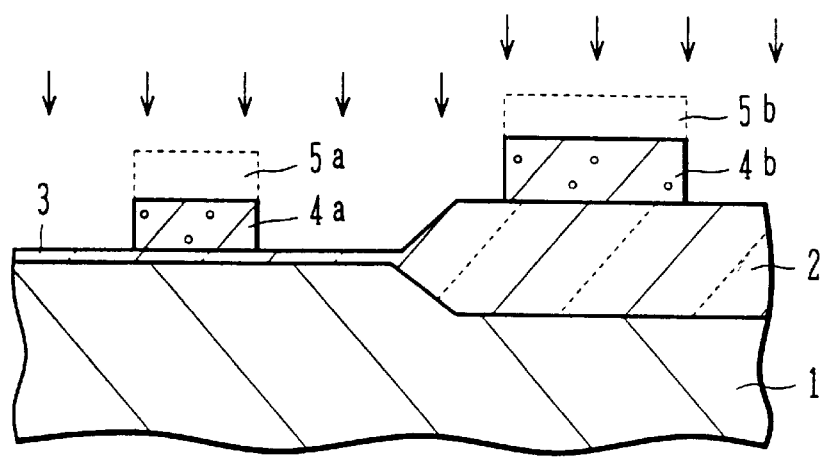

As shown in FIG. 1B, the polycrystalline Si layer 4 is anisotropically etched by using the resist patterns 5a and 5b as an etching mask. For example, reactive ion etching (RIE) is performed by using etching gas, such as a mixed gas of Cl$_2$+O$_2$, CF$_4$ gas, and SF$_6$ gas.

The conditions of etching the polycrystalline Si layer 4 are, for example:

gas=Cl$_2$+O$_2$;

microwave power=1400 W;

RF power=45 W; and pressure=2 mTorr.

In the above manner, a polycrystalline Si layer 4a for the gate electrode and a polycrystalline Si layer 4b for the lower capacitor electrode are formed. Thereafter, the resist patterns 5a and 5b are removed by ashing with oxygen plasma, wet process with remover liquid, or other processes.

Figure 1C:
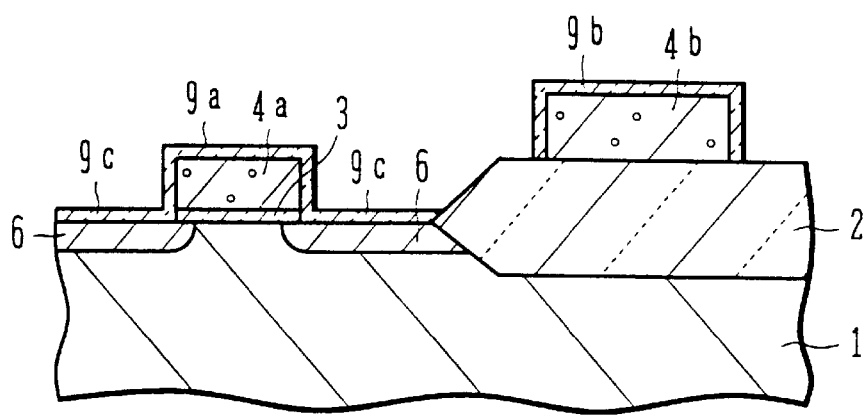

Next, as shown in FIG. 1C, by using the patterned gate electrode 4a and the field oxide film 2 as a mask, impurity ions are implanted to form regions 6 of a lightly doped drain (LDD) structure of a MOS transistor. If the semiconductor substrate 1 is of a p-type, these LDD regions 6 are lightly doped n-type regions.

After the LDD regions 6 are formed, an insulating film is formed on the surfaces of the gate electrode 4a and the lower capacitor electrode 4b respectively made of polycrystalline Si. This insulating film is used as an insulating film covering the surface of the gate electrode, and as a capacitor dielectric film.

For example, if a silicon oxide film 50 to 100 nm thick is to be formed as the capacitor dielectric film, the semiconductor substrate is heated and thermally oxidized in a wet atmosphere, to form silicon oxide films 9a and 9b on the polycrystalline Si layers 4a and 4b.

Since the gate oxide film 3 is formed on the active regions of the semiconductor substrate 1 and also an oxidation speed of single crystal Si is slower than polycrystalline Si, an oxide film 9c formed on the LDD region 6 is thinner than oxide films 9a and 9b formed on the polycrystalline layers 4a and 4b. With wet oxidation at 800° to 900° C., the thickness of oxidized polycrystalline Si is about 5 to 10 times as thick as that of oxidized single crystal Si. Since the field oxide film 2 is as thick as several hundred nm, its thickness hardly changes with this wet oxidation.

Instead of wet oxidation, dry oxidation may be used. Oxidizable materials other than Si may be used for the gate electrode and lower capacitor electrode to form the surface oxide film. The capacitor dielectric film may be formed by depositing insulating material by CVD, sputtering, or other processes. Materials having a high dielectric constant such as SiN and Ta$_2$O$_5$ may also be used.

Figure 1D:
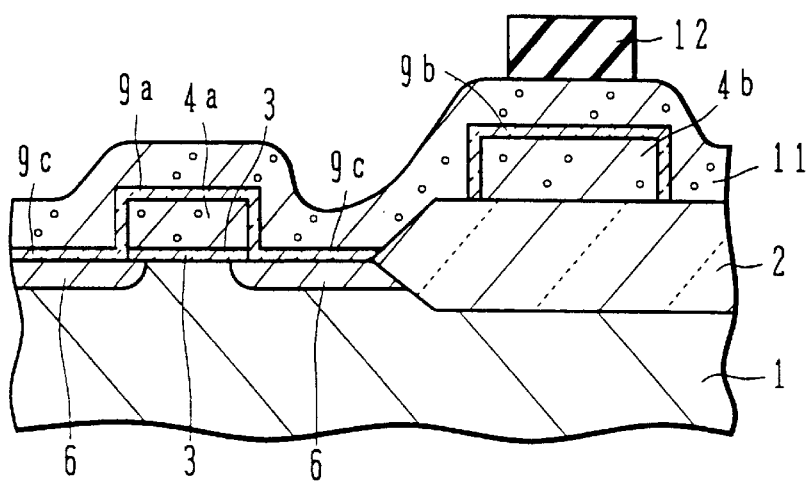

Next, as shown in FIG. 1D, a second polycrystalline Si layer 11 is deposited over the semiconductor substrate, for example, to a thickness of 200 to 400 nm, by CVD under the previously described conditions. Refractor metal or its silicide may be stacked on this second polycrystalline Si layer 11. Instead of the polycrystalline Si layer 11, conductive material including refractory metal such as W, Ti, Mo, Ta and their silicide may be used.

Next, impurity ions are implanted on the deposited polycrystalline Si layer 11 to impart a desired conductivity. The flat portion of the polycrystalline Si layer 11 is implanted with impurity ions at a desired dose. The conditions of implanting impurity ions are, for example:

ion=P+;

acceleration energy=40 keV; and dose=1.0×10$^{16}$cm$^{-2}$.

Impurity doping may also be performed by thermal diffusion using POCl$_3$.

A photoresist layer, for example, novolak, is spin-coated on the polycrystalline Si layer 11, and exposed and developed to form a resist pattern 12 for the upper capacitor electrode.

Figure 1E:
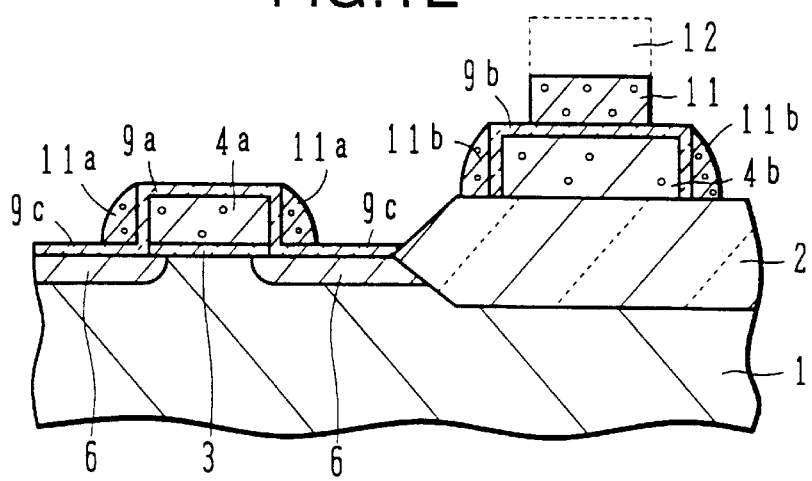

As shown in FIG. 1E, the polycrystalline Si layer 11 is anisotropically etched by using the resist pattern 12 as an etching mask. For example, RIE is performed by using etching gas, such as a mixed gas of Cl$_2$+O$_2$, CF$_4$ gas, and SF$_6$ gas.

The conditions of etching the polycrystalline Si film 11 are, for example:

gas=Cl$_2$+O$_2$;

microwave power=1400 W;

RF power=45 W; and pressure=2 mTorr.

In this anisotropic etching, the silicon oxide films 9c, 9a, and 9b respectively on the LDD region 6, gate electrode 4a, and lower capacitor electrode 4b, and the field oxide film function as etch stoppers.

On the side walls of the gate electrode 4a and lower capacitor electrode 4b, polycrystalline Si regions are left as side wall spacers. The polycrystalline Si layer 11 is also left under the resist pattern 12. Thereafter, the resist pattern is removed by ashing. The surface of the left polycrystalline layer 11 may be oxidized.

Figure 1F:
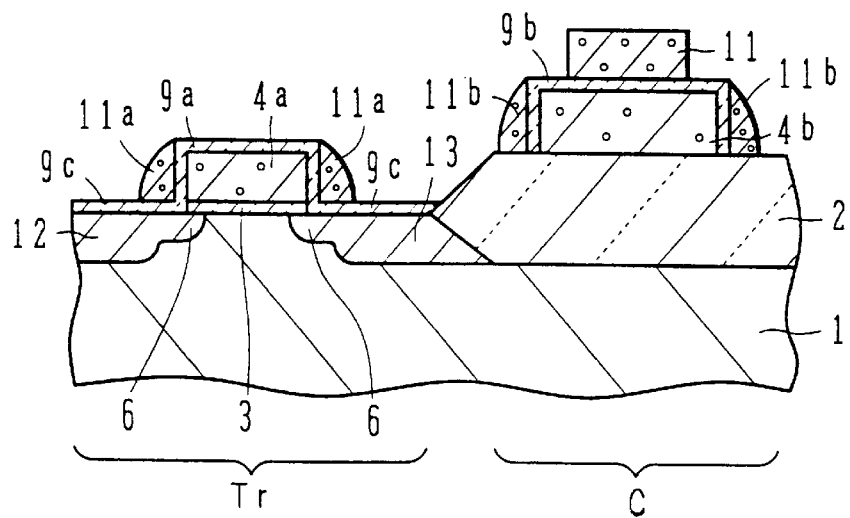

As shown in FIG. 1F, n-type impurity ions are implanted down to the semiconductor substrate to form n+-type source/drain regions 12 and 13 on both sides of the gate electrode 4a. With this ion implantation, the upper regions of the upper capacitor electrode, the left polycrystalline Si layer 12, and the side wall spacers are also doped. When the side wall spacer has a larger height than that of the upper capacitor electrode, it will have a higher resistivity than that of the upper capacitor electrode, after activation of the implanted impurity.

In the above manner, a MOS transistor Tr of an LDD structure can be formed in the active region, and a capacitor C can be formed on the field oxide film. For the gate oxide film, other insulating films may also be used. The gate electrode and lower capacitor electrode may also be made of conductive material other than Si. In these cases, an insulating gate type FET is formed in place of a MOS transistor. Thereafter, an interlayer insulating film and a wiring layer are formed through well-known processes.

If both the lower and upper capacitor electrodes are made of polycrystalline Si, the capacitance—voltage characteristics of the capacitor becomes symmetrical relative to a voltage polarity.

Figure 2:
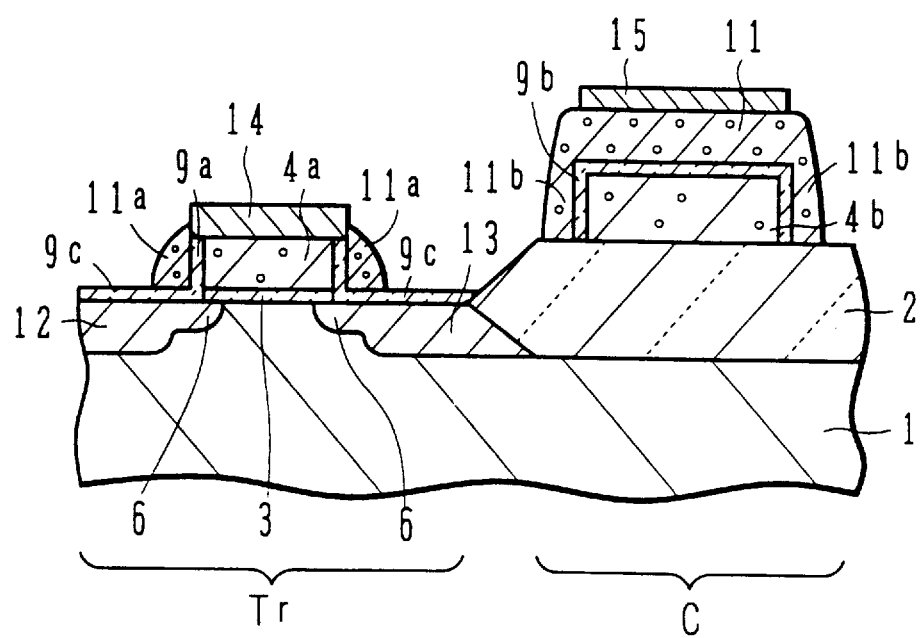
FIGS. 2 and 3 are cross sectional views of semiconductor devices according to other embodiments of the invention.

Although the upper capacitor electrode is shown smaller than the lower capacitor electrode, this is not limitative but as shown in FIG. 2 the upper capacitor electrode may be larger than the lower capacitor electrode. In the structure shown in FIG. 2, the side walls 11b merge with the capacitor upper electrode. After the process of FIG. 1F, the exposed oxide film 9a on the gate electrode may be removed by dilute hydrofluoric acid aqueous solution or by reactive ion etching, and refractory metal silicide layers 14 and 15 may be further deposited to form polycide layers. Alternatively, a refractory metal layer may be deposited and reacted with underlying Si to form silicide layers.

In this embodiment, side spacers of the gate electrode are made of conductive material such as polycrystalline silicon. It can be anticipated therefore that parasitic capacitance between the gate and source or drain increases. However, since the parasitic capacitance between the gate and LDD regions, with the gate oxide film being interposed therebetween, is larger than the parasitic capacitance between the gate and source or drain, the latter parasitic capacitance affects less as a whole.

The gate of an FET and the lower capacitor electrode are patterned (etched) by using one mask, and also the upper capacitor electrode and the side spacers of the gate and lower capacitor electrode are patterned (etched) by using one mask.

Figure 3:
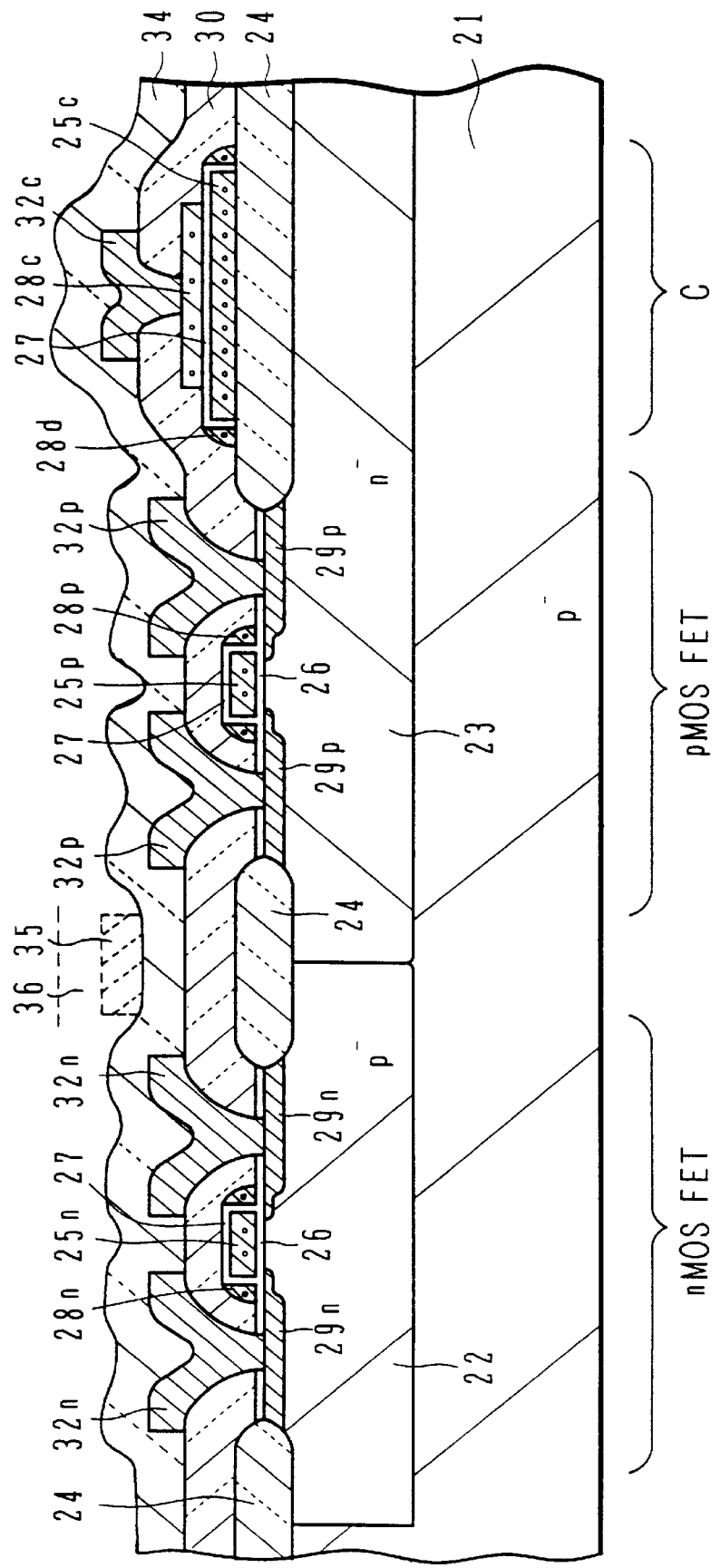

FIG. 3 shows an example of a CMOS analog IC. In the surface layer of a p-type Si substrate, a p-type well 22 and an n-type well 23 are formed. Thereafter, field oxide films 24 are formed on the surface of the Si substrate by local oxidation of silicon (LOCOS). The field oxide films 24 define active regions in the p- and n-type wells 22 and 23. An n-channel MOS FET transistor nMOSFET is formed in the p-type well 22 and a p-channel MOS FET transistor pMOSFET is formed in the n-type well 23.

Gate oxide films 26 are formed on the surface of the active regions of the p- and n-type wells 22 and 23. On the gate oxide films, gate electrodes 25n and 25p of polycrystalline Si are formed. At the same time when these gate electrodes 25n and 25p are formed, a lower capacitor electrode 25c is formed on the broad area of the field oxide film 24. On the surfaces of these polycrystalline Si regions 25n, 25p, and 25c, silicon oxide films 27 are formed to a thickness of about 50 to 100 nm. On the side walls of these polycrystalline Si regions 25n, 25p, and 25c, polycrystalline Si side wall spacers 28n, 28p, and 28d are formed. On the silicon oxide film 27 on the upper surface of the lower capacitor electrode 25c, an upper capacitor electrode 28c of polycrystalline Si is formed by the same process of forming the side wall spacers. The n-channel MOS transistor nMOSFET and p-channel MOS transistor pMOSFET can be formed by partially sharing the processes similar to those described with FIGS. 1A to 1F.

Source/drain regions 29n and 29p of an LDD structure are formed on both sides of the gate electrodes by ion implantation. For this ion implantation, an ion implantation resist mask is formed and ions are implanted only into desired regions.

An interlayer insulating film 30 is formed covering the insulated gate electrode structure and capacitor. The interlayer insulating film 30 is made of $SiO_2$, phosphosilicate glass (PSG), or borophosphosilicate glass (BPSG). Contact holes are formed through the interlayer insulating film 30 at areas corresponding to the source/drain regions and the upper capacitor electrode to form electrodes 32n, 32p, and 32c which are connected to the respective source/drain regions 29n and 29p and the upper capacitor electrode 28c. Although not shown, a contact hole is formed in the interlayer insulating film 30 at the area of the lower capacitor electrode extended in the direction perpendicular to the drawing sheet to form the lower capacitor electrode contact.

Another interlayer insulating film 34 is formed covering these contact electrodes. An upper level wiring layer 35 may be formed on the interlayer insulating film 34 provided with via holes at necessary areas. An insulating layer 36 is formed thereon. In the above manner, a CMOS analog IC with a capacitor on the field oxide film (for example, Op-Amp) can be formed.

The process of forming an upper capacitor electrode can be simplified by forming side wall spacers of a MOS transistor by polycrystalline silicon. These elements can be formed through common processes to have substantially the same composition and thickness. Here, the term "substantially" is intended to cover unintentional variations or deviations. The side wall spacers and upper capacitor electrode may be formed by conductive material other than polycrystalline Si. Other semiconductor devices such as digital ICs may be formed by similar processes with similar structures.

The present invention has been described in connection with the preferred embodiments. The invention is not limited only to the above embodiments. It will be apparent to those skilled in the art that various modifications, improvements, combinations and the like can be made without departing from the scope of the appended claims.

I claim:

1. A semiconductor device comprising:
   a semiconductor substrate with a principal surface;
   a field insulating film formed on the principal surface of said semiconductor substrate and defining an active region;
   an insulated gate structure formed in the active region and including a gate insulating film and a first conductive layer;
   a lower capacitor electrode formed on the field insulating film and including a second conductive layer having substantially same composition and thickness as the first conductive layer;
   an insulating film formed on the surfaces of the first and second conductive layers;
   conductive side wall regions formed on side walls of the first and second conductive layers; and an upper capacitor electrode formed on said insulating film on the upper surface of the second conductive layer and made of the same material as the conductive material of said conductive side wall regions.

2. A semiconductor device according to claim 1, wherein said semiconductor substrate is made of silicon, and said field oxide film is made of silicon oxide.

3. A semiconductor device according to claim 2, wherein said gate insulating film is made of silicon oxide.

4. A semiconductor device according to claim 3, wherein said first and second conductive layers are made of doped polycrystalline silicon.

5. A semiconductor device according to claim 4, wherein said insulating film is made of silicon oxide film.

6. A semiconductor device according to claim 4, wherein said conductive side wall regions are made of polycrystalline silicon, refractory metal, or refractory metal silicide.

7. A semiconductor device according to claim 4, wherein said conductive side wall regions are made of polycrystalline silicon, and have a resistivity higher than that of said upper capacitor electrode.

8. A semiconductor device according to claim 5, wherein said conductive side wall regions are made of polycrystalline silicon, and have a resistivity higher than that of said upper capacitor electrode.

9. A semiconductor device according to claim 5, further comprising a pair of source/drain regions formed on both sides of said insulated gate structure in said semiconductor substrate.

10. A semiconductor device according to claim 9, wherein said source/drain regions have a lightly doped drain structure.

* * * * *